(12) United States Patent
Mathew et al.

(10) Patent No.: US 9,286,933 B2
(45) Date of Patent: Mar. 15, 2016

(54) SYSTEMS AND METHODS FOR CONTROLLED DATA PROCESSOR OPERATIONAL MARGINALIZATION

(71) Applicant: LSI Corporation, Milpitas, CA (US)

(72) Inventors: George Mathew, San Jose, CA (US); Haotian Zhang, Longmont, CO (US); Haitao Xia, San Jose, CA (US); Bruce Wilson, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 381 days.

(21) Appl. No.: 13/686,164

(22) Filed: Nov. 27, 2012

(65) Prior Publication Data

US 2014/0149796 A1    May 29, 2014

(51) Int. Cl.

| | | |
|---|---|---|
| *G06F 11/00* | (2006.01) | |
| *G11B 20/10* | (2006.01) | |
| *H03M 13/37* | (2006.01) | |
| *H03M 13/00* | (2006.01) | |
| *H03M 13/11* | (2006.01) | |
| *H03M 13/15* | (2006.01) | |
| *H03M 13/41* | (2006.01) | |

(52) U.S. Cl.
CPC ..... *G11B 20/10009* (2013.01); *G11B 20/10046* (2013.01); *G11B 20/10055* (2013.01); *H03M 13/3738* (2013.01); *H03M 13/3753* (2013.01); *H03M 13/6331* (2013.01); *H03M 13/6343* (2013.01); *H03M 13/1105* (2013.01); *H03M 13/1515* (2013.01); *H03M 13/41* (2013.01)

(58) Field of Classification Search
CPC .... H04B 17/402; H04B 17/406; H04L 1/242; H04L 7/033; H03L 7/093; H03K 5/1534
USPC .......................................................... 714/41
See application file for complete search history.

(56) References Cited

U.S. PATENT DOCUMENTS

| | | | | |
|---|---|---|---|---|
| 5,001,712 | A | * | 3/1991 | Splett et al. .................... 714/703 |
| 5,448,616 | A | * | 9/1995 | Kaewell et al. ................ 714/712 |
| 6,466,631 | B1 | * | 10/2002 | Schenk .......................... 375/346 |
| 6,536,003 | B1 | * | 3/2003 | Gaziello et al. ............... 714/710 |
| 7,064,913 | B2 | | 6/2006 | Gunderson et al. |
| 7,372,651 | B2 | | 5/2008 | Gunderson et al. |
| 7,570,447 | B2 | | 8/2009 | Koga et al. |
| 7,990,648 | B1 | | 8/2011 | Wang |
| 2003/0128448 | A1 | | 7/2003 | Gunderson et al. |
| 2004/0003724 | A1 | | 1/2004 | Ellis |
| 2004/0030738 | A1 | * | 2/2004 | Haydock ....................... 709/200 |

(Continued)

OTHER PUBLICATIONS

Jacques-Silva, "Fault Injection-based Assessment of Partial Fault Tolerance in Stream Processing Applications" 7/11, ACM, p. 1-112.*

(Continued)

*Primary Examiner* — Bryce Bonzo
*Assistant Examiner* — Jeison C Arcos

(57) ABSTRACT

Systems, methods, devices, circuits for data processing, and more particularly to data processing including operational marginalization capability. In one case a data processing system is disclosed that includes a loop detector circuit and a sample based noise injection circuit. The loop detector circuit applies a loop detection algorithm to a data input to yield a loop detected output, and the sample based noise injection circuit generates a noise component based at least in part on the loop detected output.

19 Claims, 5 Drawing Sheets

(56) References Cited

U.S. PATENT DOCUMENTS

| | | | |
|---|---|---|---|
| 2005/0050393 A1* | 3/2005 | Chakraborty et al. | 714/30 |
| 2005/0110567 A1* | 5/2005 | Rabinovich et al. | 330/149 |
| 2007/0089006 A1* | 4/2007 | Zimmerman | 714/738 |
| 2009/0274247 A1* | 11/2009 | Galbraith et al. | 375/341 |
| 2011/0246831 A1* | 10/2011 | Das et al. | 714/37 |
| 2013/0047053 A1* | 2/2013 | Jin et al. | 714/758 |
| 2013/0326302 A1* | 12/2013 | Han et al. | 714/752 |

OTHER PUBLICATIONS

U.S. Appl. No. 13/710,351, filed Dec. 10, 2012, Lu, Lu et al.

U.S. Appl. No. 13/722,207, filed Dec. 20, 2012, Shingleton, Jefferson, et al.

* cited by examiner

US 9,286,933 B2

SYSTEMS AND METHODS FOR CONTROLLED DATA PROCESSOR OPERATIONAL MARGINALIZATION

FIELD OF THE INVENTION

Embodiments are related to systems and methods for data processing, and more particularly to systems and methods for controlled degradation of a data processing system.

BACKGROUND

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The data processing includes application of various data processing algorithms to recover originally written data. Such processing results in a very small number of errors that in some cases are due to corruption of the originally received data. Such a level of errors make it difficult to make adjustments to either correct for the type of errors or make it difficult to characterize the quality of a device.

Hence, for at least the aforementioned reasons, there exists a need in the art for advanced systems and methods for data processing.

SUMMARY

Embodiments are related to systems and methods for data processing, and more particularly to systems and methods for controlled degradation of a data processing system.

Various embodiments of the present invention provide data processing systems. The data processing systems include a sample based noise injection circuit, and a processing circuit. Sample based noise injection circuit is operable to: generate a noise component based at least in part on a data input, add the noise component to the data input to yield a noise injected output, and select one of the data input and the noise injected output as a processing input. The processing circuit is operable to apply a data processing algorithm to the processing input to yield a data output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
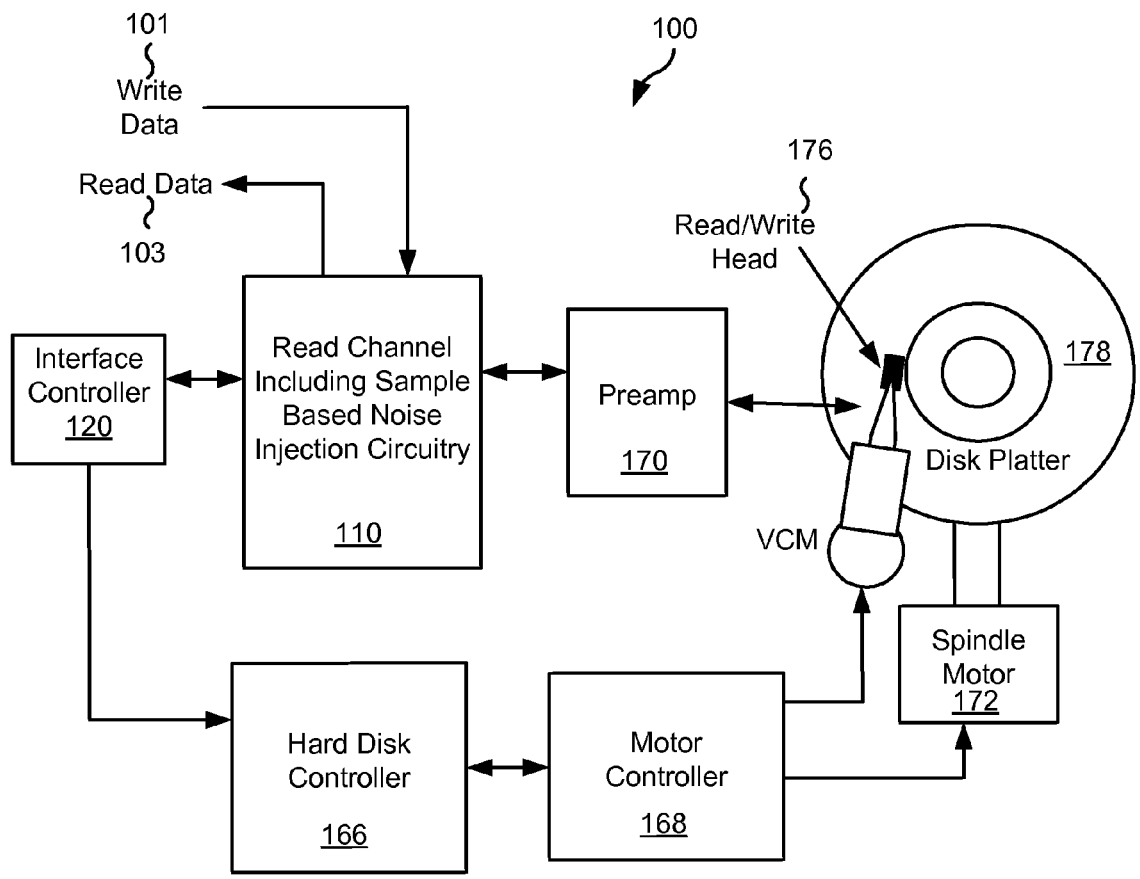
FIG. 1 shows a storage system including sample based noise injection circuitry in accordance with various embodiments of the present invention.

Embodiments are related to systems and methods for data processing, and more particularly to systems and methods for controlled degradation of a data processing system.

Various embodiments of the present invention provide data processing systems. The data processing systems include a sample based noise injection circuit, and a processing circuit. sample based noise injection circuit is operable to: generate a noise component based at least in part on a data input, add the noise component to the data input to yield a noise injected output, and select one of the data input and the noise injected output as a processing input. The processing circuit is operable to apply a data processing algorithm to the processing input to yield a data output. In some instances of the aforementioned embodiments, the bit-resolution of noise injected output is higher (e.g. 13 bits) than regular output of equalizer (or input of data detector circuit)(e.g., 6 bits). In such instances, before passing the noise-injected sample to the detector or y-sample buffer, the resolution is reduced.

In some instances of the aforementioned embodiments, the sample based noise injection circuit includes a summation circuit operable to subtract an ideal output derived from the data input to yield a sum, and a multiplier circuit operable to multiply the sum by a scalar value to yield the noise component. In some cases, the scalar is programmable. In various cases, the scalar is less than unity. In one or more instances of the aforementioned embodiments, the system further includes a detector circuit. The detector circuit is operable to apply a data detection algorithm to the processing input to yield a detected output. In such instances, the sample based noise injection circuit includes a partial response filter circuit operable to apply partial response filtering to the detected output to yield the ideal output. In some cases, the resolution of the data input is greater than the resolution of the detector input. In one or more cases, the resolution of the data input is thirteen bits, and wherein the resolution of the detector input is six bits. In various cases, the resolution of the noise component is greater than the resolution of the detector input.

In various instances of the aforementioned embodiments, the sample based noise injection circuit includes a selector circuit and a summation circuit. The selector circuit is operable to select between a zero value and the noise component as a noise additive. The summation circuit is operable to add the data input to the noise component to yield the processing input.

Other embodiments of the present invention provide methods for data processing that include: receiving a data input; generating a noise component based at least in part on the data input; adding the noise component to the data input to yield a noise injected output; selecting one of the noise component and a zero component as a sum input; adding the sum input to the data input to yield a selectively noise injected output; and processing the selectively noise injected output to yield a data output. In some instances of the aforementioned embodiments, generating the noise component based at least in part on the data input includes: applying a data detection algorithm to the selectively noise injected output to yield a detected output; applying a partial response filtering to the detected output to yield an ideal output; subtracting the ideal output from the data input to yield a sum; and multiplying the sum by a scalar to yield the noise component. In some cases, the resolution of the data input is greater than the resolution of the detector input. In one particular case, the resolution of the data input is thirteen bits, and the resolution of the detector input is six bits. In one or more cases, the resolution of the noise component is greater than the resolution of the detector input.

Turning to FIG. 1, a storage system 100 including a read channel circuit 110 having sample based noise injection circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of a device characterization process, read channel circuit 110 selects a test control causing a noise component to be added to data being accessed from disk platter 178. The noise being added is designed to raise a minimal error rate generally yielded by read channel circuit 110 to an error rate that can meaningfully characterize storage system 100. The noise being added is generated based upon data being accessed from disk platter 178 and is thus more representative of actual system operation than other types of noise that may be added. In some cases, the read channel circuit may include circuitry similar to that discussed in relation to FIG. 3 and/or FIG. 5 below; and/or may operate similar to the methods discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
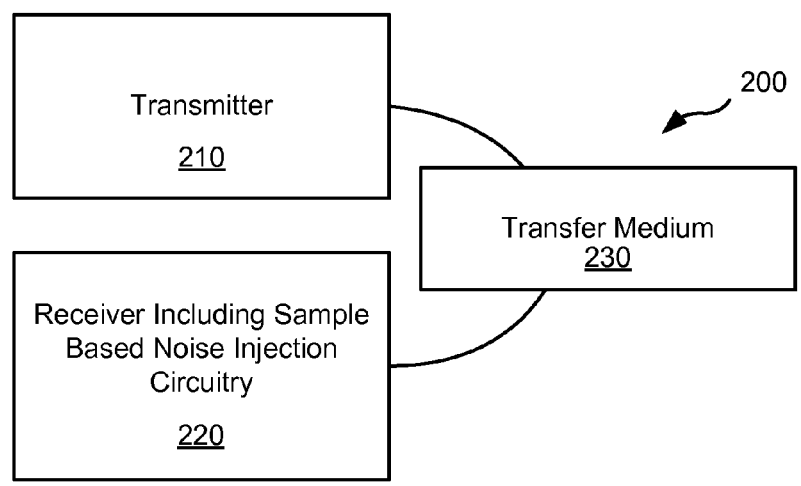
FIG. 2 depicts a data transmission system including sample based noise injection circuitry in accordance with one or more embodiments of the present invention.

Turning to FIG. 2, a data transmission system 200 including a receiver 220 having data detection circuitry is shown in accordance with various embodiments of the present invention. Data transmission system 200 includes a transmitter 210 that is operable to transmit encoded information via a transfer medium 230 as is known in the art. The encoded data is received from transfer medium 230 by a receiver 220. Receiver 220 processes the received input to yield the originally transmitted data.

As part of a device characterization process, receiver 220 selects a test control causing a noise component to be added to data being accessed from transfer medium 230. The noise being added is designed to raise a minimal error rate generally yielded by receiver 220 to an error rate that can meaningfully characterize data transmission system 200. The noise being added is generated based upon data being received via transfer medium 230 and is thus more representative of actual system operation than other types of noise that may be added. In some cases, the receiver may include circuitry similar to that discussed in relation to FIG. 3 and/or FIG. 5 below; and/or may operate similar to the methods discussed below in relation to FIGS. 4a-4b.

Figure 3:
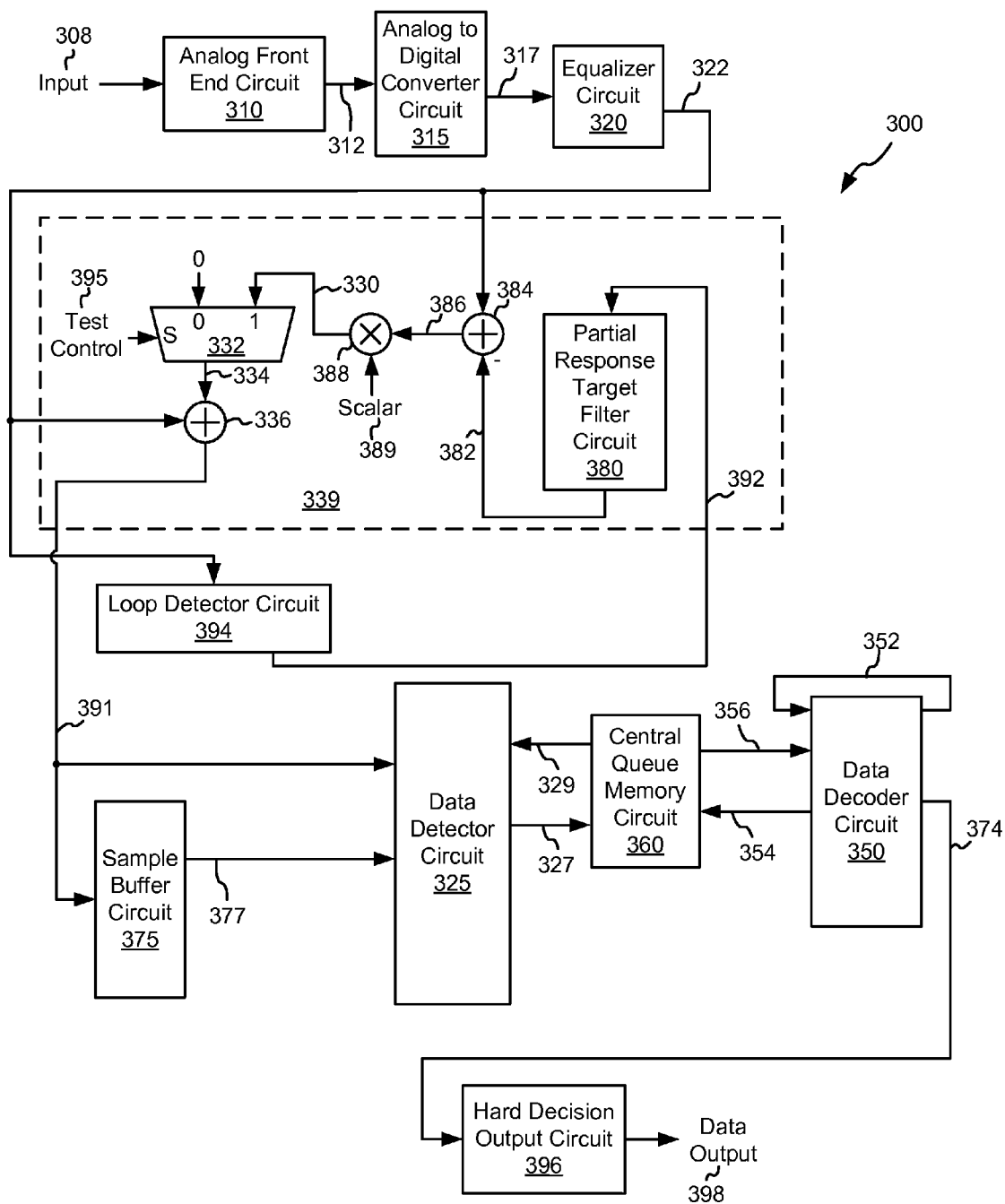
FIG. 3 shows a data processing circuit including a sample based noise injection circuit in accordance with some embodiments of the present invention.

FIG. 3 shows a data processing circuit 300 including a sample based noise injection circuit 339 in accordance with some embodiments of the present invention. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input signal 308 is derived from a read/write head assembly (not shown) that is disposed in relation to a storage medium (not shown). In other cases, analog input signal 308 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input signal 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art. It may be possible that equalized output 322 may be received directly from a storage device in, for example, a solid state storage system. In such cases, analog front end circuit 310, analog to digital converter circuit 315 and equalizer circuit 320 may be eliminated where the data is received as a digital data input.

Equalized output 322 is provided to sample based noise injection circuit 339 that selectively adds a noise component 334 to equalized output 322 to yield a selective noise output 391. Sample based noise injection circuit 339 includes a partial response target filter circuit 380, a summation circuit 384, a multiplier circuit 388, a selector circuit 332, and a summation circuit 336. In operation, partial response target filter circuit 380 receives a detected output 392 from a loop detector circuit 394 that is more fully described below. Detected output 392 is a representation, and is derived from, the data from which analog signal 308 was derived. Partial response target filter circuit 380 may be any circuit known in the art that is capable of applying target based filtering to an input signal to yield an output conformed to a target. In this case, partial response target filter circuit 380 applies target filtering to detected output 392 to yield a target filtered output 382. Target filtered output 382 is an ideal approximation of equalized output 322.

Target filtered output 382 is provided to summation circuit 384 where it is subtracted from equalized output 322 to yield a sum 386 which is provided to multiplier circuit 388. Multiplier circuit 388 multiplies sum 386 by a scalar 389 to yield a product 330. In some cases, scalar 389 is programmable, while in other cases it is fixed. In one particular embodiment, scalar 389 is less than unity (i.e., '1'). Product 330 represents noise derived from equalized output 322, and is provided to selector circuit 332. When a test control 395 is asserted to indicate that test data is selected, product 330 is provided by selector circuit 332 as noise component 334. Otherwise, when test control 395 is asserted to indicate standard processing, a zero value '0' is provided by selector circuit 332 as noise component 334. Test control 395 may be user programmable. Test control 395 may be asserted to indicate that test data is selected when a user desires to test operation of data processing circuit 300. Test control 395 may be de-asserted to indicate that standard data is selected when a user desires standard operation of data processing circuit 300. Noise component 334 is provided to summation circuit 336 where it is added to equalized output 322 to yield selective noise output 391. Where standard operation of data processing circuit 300 is selected by test control 395, selective noise output 391 is equalized output 322 unmodified. Alternatively, where test operation of data processing circuit 300 is selected by test control 395, selective noise output 391 is modified to include noise component 334.

Equalized output 322 is also provided to loop detector circuit 394. Loop detector circuit 394 may be any circuit known in the art that applies some type of algorithm designed to return a representation of the data from which analog signal 308 was derived. In one particular embodiment of the present invention, loop detector circuit 394 is operable to determine timing feedback and other operations designed to align the sampling of analog to digital converter circuit 315 with the received data set, and/or to adjust a gain applied by analog front end circuit 310. Based upon the disclosure provided herein, one of ordinary skill in the art will recognize a variety of circuits capable of providing a representation of the data from which analog signal 308 was derived that may be used in relation to different embodiments of the present invention.

In addition, selective noise output 391 is stored to a sample buffer circuit 375 that includes sufficient memory to maintain one or more codewords until processing of that codeword is completed through data detector circuit 325 and a data decoder circuit 350 including, where warranted, multiple "global iterations" defined as passes through both data detector circuit 325 and data decoder circuit 350 and/or "local iterations" defined as passes through data decoding circuit 350 during a given global iteration. Sample buffer circuit 375 stores the received data as buffered data 377.

Data detector circuit 325 is a data detector circuit capable of producing a detected output 327 by applying a data detection algorithm to a data input. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Data detector circuit 325 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. When data decoder circuit 350 is available, data decoder circuit 350 receives detected output 327 from central queue memory 360 as a decoder input 356. Data decoder circuit 350 applies a data decoding algorithm to decoder input 356 in an attempt to recover originally written data. The result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 350 provides the result of the data decoding algorithm as a data output 374. Data output 374 is provided to a hard decision output circuit 396 where the data is reordered before providing a series of ordered data sets as a data output 398.

One or more iterations through the combination of data detector circuit 325 and data decoder circuit 350 may be made in an effort to converge on the originally written data set. As mentioned above, processing through both the data detector circuit and the data decoder circuit is referred to as a "global iteration". For the first global iteration, data detector circuit 325 applies the data detection algorithm without guidance from a decoded output. For subsequent global iterations, data detector circuit 325 applies the data detection algorithm to buffered data 377 as guided by decoded output 354. Decoded output 354 is received from central queue memory 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from a decoded output 352. For subsequent local iterations, data decoder circuit 350 applies the data decoding algorithm to decoder input 356 as guided by a previous decoded output 352. In some embodiments of the present invention, a default of ten local iterations is allowed for each global iteration.

Figure 4A:
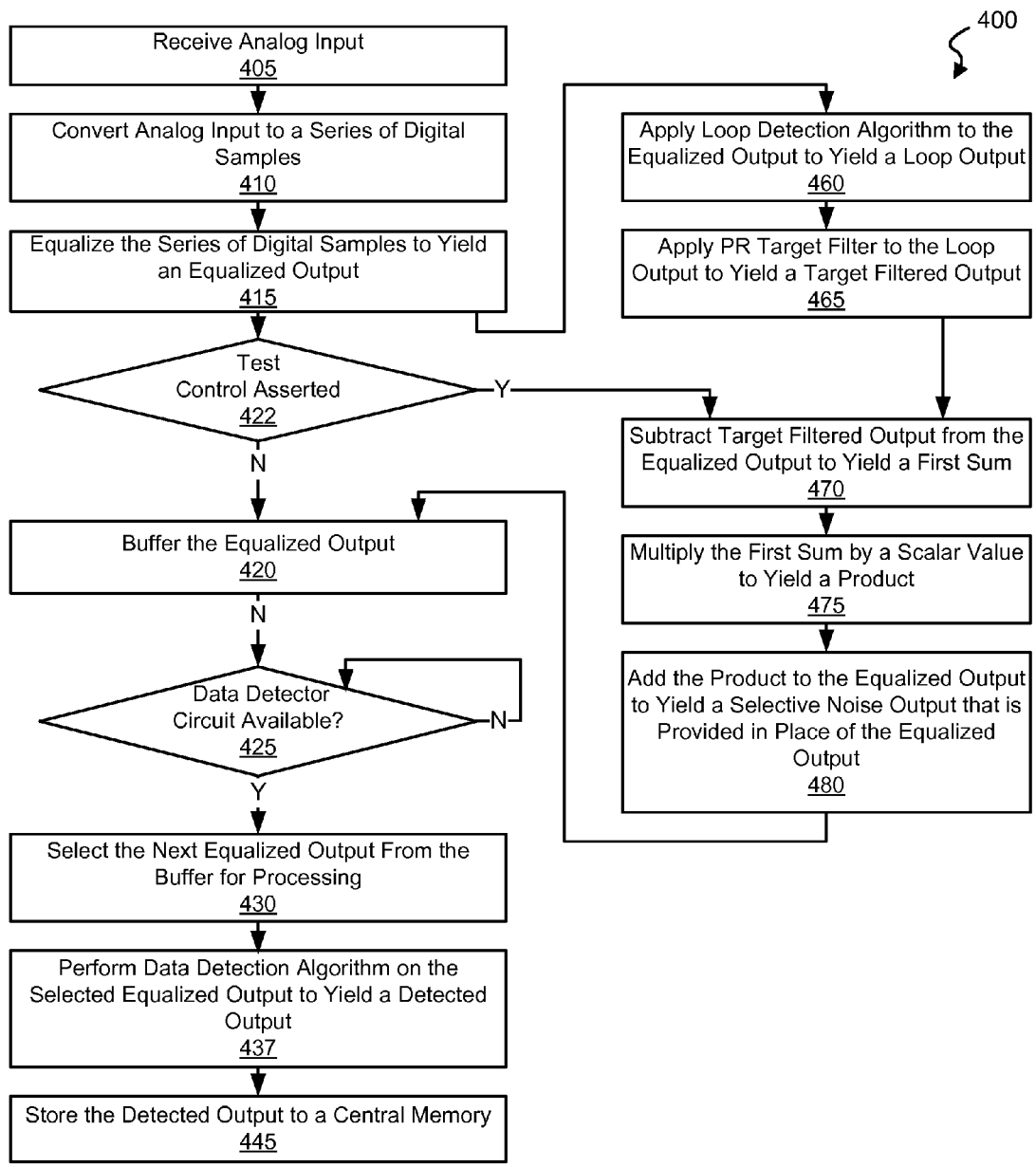
FIGS. 4a-4b are flow diagrams showing a method for data processing relying on sample based noise injection in accordance with some embodiments of the present invention.
Figure 4B:
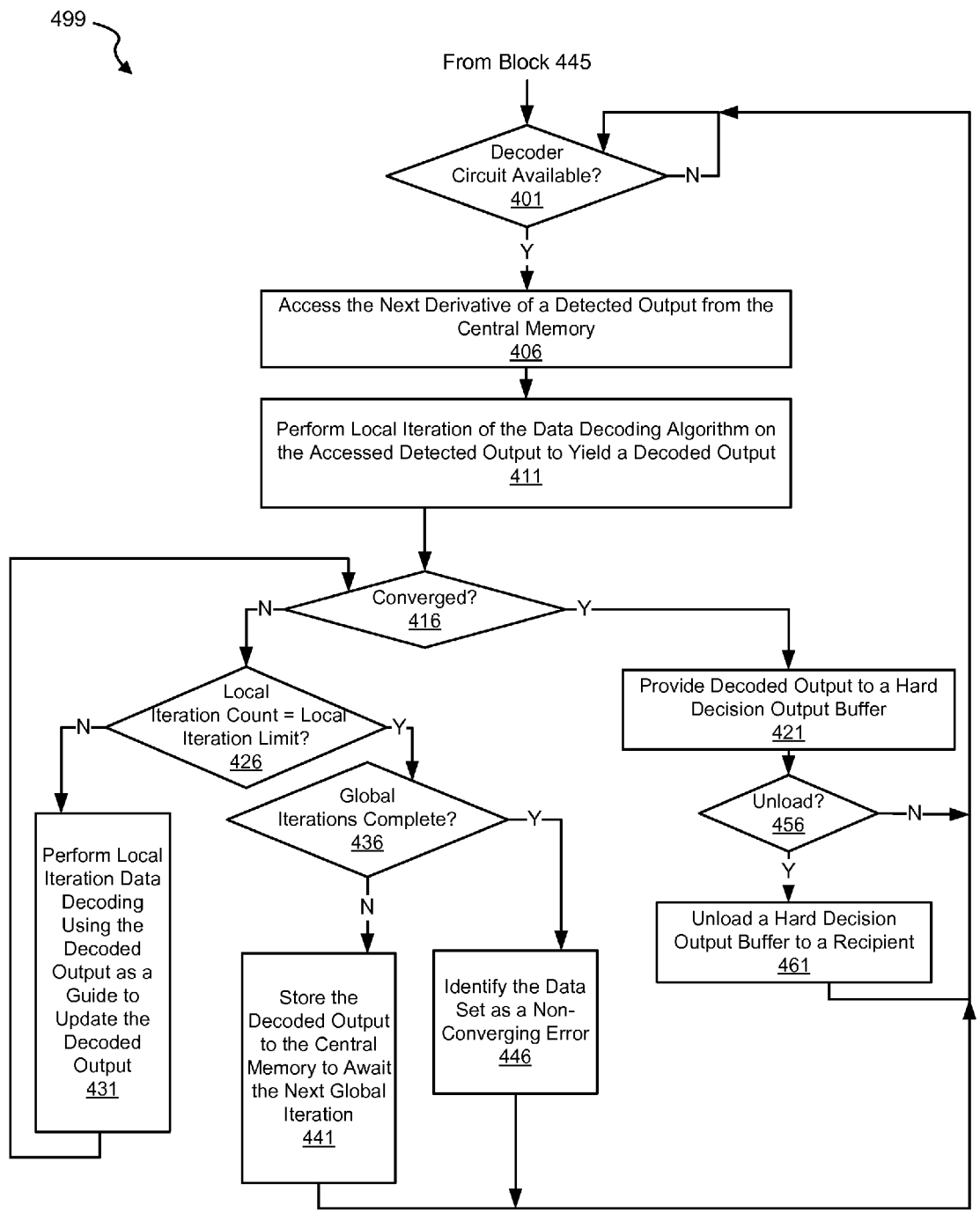

Turning to FIGS. 4a-4b are flow diagrams 400, 499 showing a method for data processing relying on sample based noise injection in accordance with some embodiments of the present invention. Following flow diagram 400 of FIG. 4a, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

A loop detection algorithm is applied to the equalized output to yield a loop output (block 460). The loop detection algorithm may be applied by any circuit known in the art that applies some type of algorithm designed to return a representation of the data from which the analog input was derived. In one particular embodiment of the present invention, the loop detection algorithm is operable to determine timing feedback and other operations designed to align the sampling related to the analog to digital conversion, and/or to adjust a gain applied by an analog front end circuit. Based upon the disclosure provided herein, one of ordinary skill in the art will recognize a variety of loop detection algorithms capable of providing a representation of the data from which the analog input was derived that may be used in relation to different embodiments of the present invention.

A partial response target filtering is applied to the loop output to yield a target filtered output (block 465). The partial response target filtering may be done by any circuit known in the art that is capable of applying target based filtering to an input signal to yield an output conformed to a target. The resulting target filtered output is an ideal approximation of the equalized output.

It is determined whether a test control is asserted indicating that noise injected test data has been selected (block 422). Where the test control is not asserted (block 422), the equalized output is buffered (block 420). Alternatively, where the test control is asserted (block 422), the target filtered output is subtracted from the equalized output to yield a first sum (block 470). The first sum is multiplied by a scalar value to yield a product (block 475), and the product is added to the equalized output to yield a selective noise output that is provided in place of the equalized output (block 480). This modified equalized output is then buffered (block 420).

It is determined whether a data detector circuit is available to process the buffered equalized output (block 425). Where a data detector circuit is available to process a data set (block 425), the next available equalized output from the buffer is selected for processing (block 430). A data detection algorithm is then applied to the selected equalized output to yield a detected output (block 437). The data detection algorithm may be, for example, a Viterbi algorithm data detection or a maximum a posteriori data detection algorithm. The detected output (or a derivative thereof) is then stored to a central memory (block 445).

Turning to FIG. 4b and following flow diagram 499, it is determined whether a data decoder circuit is available (block 401) in parallel to the previously described data detection process of FIG. 4a. The data decoder circuit may be, for example, a low density parity check data decoder circuit as are known in the art. Where the data decoder circuit is available (block 401) the next derivative of a detected output is selected from the central memory (block 406). The derivative of the detected output may be, for example, an interleaved (shuffled) version of a detected output from the data detector circuit. A first local iteration of a data decoding algorithm is applied by the data decoder circuit to the selected detected output to yield a decoded output (block 411). It is then determined whether the decoded output converged (e.g., resulted in the originally written data as indicated by the lack of remaining unsatisfied checks) (block 416).

Where the decoded output converged (block 416), it is provided as a decoded output codeword to a hard decision output buffer (e.g., a re-ordering buffer) (block 421). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 456). Where the currently received output codeword is either sequential to a previously reported codeword or completes an ordered set of codewords (block 456), the currently received output codeword and, where applicable, other codewords forming an in order sequence of codewords are provided to a recipient as an output (block 461).

Alternatively, where the decoded output failed to converge (e.g., errors remain) (block 416), it is determined whether the number of local iterations already applied equals the maximum number of local iterations (block 426). In some cases, a default seven local iterations are allowed per each global iteration. Based upon the disclosure provided herein, one of ordinary skill in the art will recognize another default number of local iterations that may be used in relation to different embodiments of the present invention. Where another local iteration is allowed (block 426), the data decoding algorithm is applied to the selected data set using the decoded output as a guide to update the decoded output (block 431). The processes of blocks starting at block 416 are repeated for the next local iteration.

Alternatively, where all of the local iterations have occurred (block 426), it is determined whether all of the global iterations have been applied to the currently processing data set (block 436). Where the number of global iterations has not completed (block 436), the decoded output is stored to the central queue memory circuit to await the next global iteration (block 441). Alternatively, where the number of global iterations has completed (block 436), an error is indicated and the data set is identified as non-converging (block 446).

Figure 5:
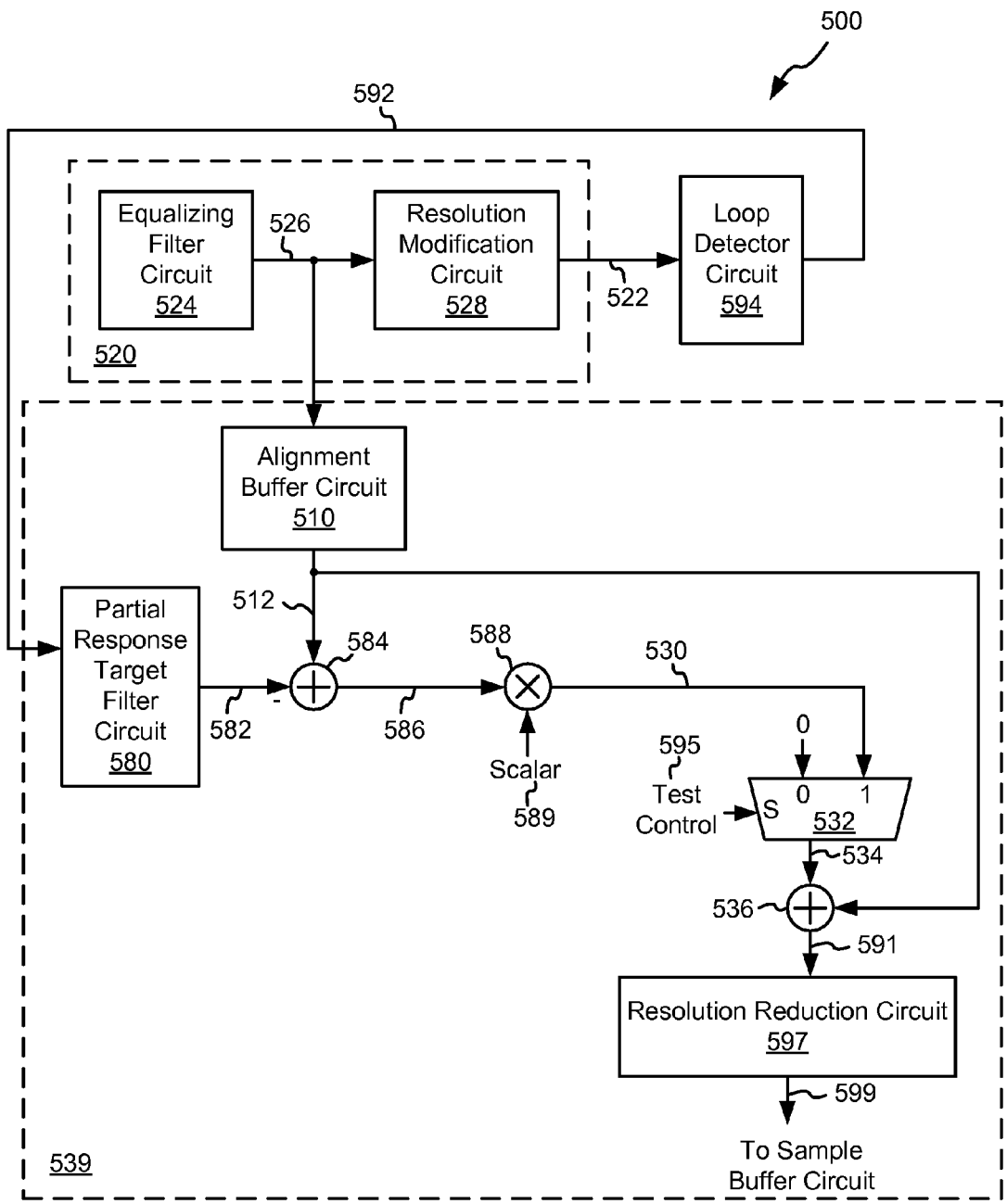
FIG. 5 shows a subset of a data processing circuit including a resolution modified sample based noise injection circuit in accordance with some embodiments of the present invention.

FIG. 5 shows a subset of a data processing circuit 500 including a resolution modified sample based noise injection circuit 539 in accordance with some embodiments of the present invention. Data processing circuit 500 is similar to data processing circuit 300 described above in relation to FIG. 3, except that data processing circuit 500 further includes resolution modification circuitry used to enhance the accuracy of operational marginalization. In particular, an equalizer circuit 520 may be used in place of equalizer circuit 320 of FIG. 3, resolution modified sample based noise injection circuit 539 may be used in place of sample based noise injection circuit 339 of FIG. 3, and loop detector circuit 594 may be used in place of loop detector circuit 394. As with data processing circuit 300, equalizer circuit 520 receives a data input that may be derived, for example, from a storage medium. Equalizer circuit 520 includes an equalizing filter circuit 524 and a resolution modification circuit 528. Equalizing filter circuit 524 applies an equalization algorithm to a received data set to yield an equalized output 526 (y[n]). In particular embodiments of the present invention, equalized output 526 is a thirteen bit resolution. In some embodiments of the present invention, equalizing filter circuit 524 is a digital finite impulse response filter circuit as are known in the art.

Equalized output 526 is provided to a resolution modification circuit 528. Resolution modification circuit 528 reduces the resolution of equalized output 526 to yield a reduced resolution equalized output 522 (y[n]'). In some embodiments of the present invention, reduced resolution equalized output 522 has six bits of resolution. In some cases, resolution modification circuit 528 truncates the value of equalized output 526 to match the resolution of reduced resolution equalized output 522.

In addition, equalized output 526 is provided to an alignment buffer circuit 510 that is operable to delay equalized output 526 to provide a delayed output 512 that is aligned with a detected output derived from the corresponding instances of equalized output 526. Delayed output 512 is provided to a resolution modified sample based noise injection circuit 539 that selectively adds a noise component 534 (q[n]) to delayed output 512 to yield a selective noise output 591 (z[n]) that is directed to a resolution reduction circuit 597 that reduces the resolution of output 591 to yield a reduced output 599. The resolution reduction operates to match the resolution of reduced output 599 to the input resolution of a downstream data processing circuit (e.g., the processing circuit including data detector circuit 325 shown in FIG. 3) fed by a sample buffer circuit (e.g., sample buffer circuit 375 of FIG. 3). In some embodiments of the present invention, reduced output 599 exhibits six bits of resolution. In some cases, resolution reduction circuit 597 truncates the value of output 591 to match the resolution supported by the downstream data processing circuit.

Resolution modified sample based noise injection circuit 539 includes a partial response target filter circuit 580, a summation circuit 584, a multiplier circuit 588, a selector circuit 532, and a summation circuit 536. In operation, partial response target filter circuit 580 receives a detected output 592 from a loop detector circuit 594 that is more fully described below. Detected output 592 is a representation, and is derived from, the data from which equalized output 526 is derived. In one embodiment of the present invention, equalized output 522 (i.e., the input of the data detector circuit) may be a six bit resolution output. Partial response target filter circuit 580 may be any circuit known in the art that is capable of applying target based filtering to an input signal to yield an output conformed to a target. In this case, partial response target filter circuit 580 applies target filtering to detected output 592 to yield a target filtered output 582 (d[n]). Target filtered output 582 is an ideal approximation of equalized output 526.

Target filtered output 582 is provided to summation circuit 584 where it is subtracted from delayed output 512 to yield a sum 586 (e[n]) which is provided to multiplier circuit 588. Multiplier circuit 388 multiplies sum 586 by a scalar 589 (α)

to yield a product 530. In some cases, scalar 589 is programmable, while in other cases it is fixed. In one particular embodiment, scalar 589 is less than unity (i.e., '1'). Product 530 represents noise derived from equalized output 526, and is provided to selector circuit 532. When a test control 595 is asserted to indicate that test data is selected, product 530 is provided by selector circuit 532 as noise component 534. Otherwise, when test control 595 is asserted to indicate standard processing, a zero value '0' is provided by selector circuit 532 as noise component 534. Test control 595 may be user programmable. Test control 595 may be asserted to indicate that test data is selected when a user desires to test operation of data processing circuit 500. Test control 595 may be de-asserted to indicate that standard data is selected when a user desires standard operation of data processing circuit 500. Noise component 534 is provided to summation circuit 536 where it is added to delayed output 512 to yield selective noise output 591. Where standard operation of data processing circuit 500 is selected by test control 595, selective noise output 591 is equalized output 526 unmodified. Alternatively, where test operation of data processing circuit 500 is selected by test control 595, selective noise output 591 is modified to include noise component 534, and is reduced in resolution by resolution reduction circuit 597 to yield reduced output 599.

The signal to noise ratio of selective noise output 591 (z[n]) may be estimated in accordance with the following equation:

$$SNR\{z[n]\} \approx SNR\{y[n]\} \cdot \beta(\alpha),$$

where $$\beta(\alpha) = (1+\alpha)^{-2}.$$

The delta between the signal to noise ratios of z[n] and y[n] is represented by the following equation:

$$\Delta SNR = 10\log_{10}\left(\frac{SNR\{z[n]\}}{SNR\{y[n]\}}\right) \approx -20\log_{10}(1+\alpha).$$

Based on this, the stepsize required to obtain the desired resolution in $\Delta SNR$ may be calculated in accordance with the following equation:

$$Resolution = \left(\frac{-20}{\ln(10)}\right) \cdot \frac{\Delta\alpha}{1+\alpha},$$

where $\Delta\alpha$ is the stepsize in scalar 589.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A storage device, the storage device comprising:
   a storage medium;
   a head assembly disposed in relation to the storage medium and operable to provide a sensed signal corresponding to a data set on the storage;
   a read channel circuit including:
      an analog front end circuit operable to provide an analog signal corresponding to the sensed signal;
      an analog to digital converter circuit operable to sample the analog signal to yield a series of digital samples;
      an equalizer circuit operable to equalize the digital samples corresponding to the data set to yield a sample set;
      a loop detector circuit operable to apply a loop detection algorithm to the sample set to yield a loop detected output;
      a sample based noise injection circuit operable to:
         generate a noise component based at least in part on the loop detected output;
         add the noise component to the sample set to yield a noise injected output; and
         select one of the sample set and the noise injected output as a processing input;
      wherein the sample based noise injection circuit includes:
         a selector circuit operable to select between a zero value and the noise component as a noise additive; and
         a summation circuit operable to add the data input to the noise component to yield the processing input; and
      a processing circuit operable to apply a data processing algorithm to the processing input to yield a data output.

2. The storage device of claim 1, wherein the read channel circuit further comprises:
   a detector circuit operable to apply a data detection algorithm to the processing input to yield a detected output; and
   wherein the sample based noise injection circuit includes a partial response filter circuit operable to apply partial response filtering to the detected output to yield the ideal output.

3. A data processing system, the data processing system comprising:
   a sample based noise injection circuit operable to:
      generate a noise component based at least in part on the loop detected output;
      add the noise component to the data input to yield a noise injected output; and
      select one of the data input and the noise injected output to provide as a processing input;
   wherein the sample based noise injection circuit includes:
      a selector circuit operable to select between a zero value and the noise component as a noise additive; and
      a summation circuit operable to add the data input to the noise component to yield the processing input; and a processing circuit operable to apply a data processing algorithm to the processing input to yield a data output.

4. A data processing system, the data processing system comprising:
a loop detector circuit operable to apply a loop detection algorithm to a reduced resolution equalized output derived from an equalized output to yield a loop detected output;
a sample based noise injection circuit operable to:
generate a noise component based at least in part on the loop detected output;
add the noise component to an aligned version of the equalized output to yield a noise injected output; and
select one of the aligned version of the equalized output or the noise injected output to provide as a processing input;
a resolution modification circuit operable to reduce a resolution of the processing input to yield a resolution reduced input, such that the resolution of the processing input is greater than the resolution of the resolution reduced input; and
a processing circuit operable to apply a data processing algorithm to the resolution reduced input derived from the processing input to yield a data output.

5. The data processing system of claim 4, wherein the sample based noise injection circuit comprises:
a summation circuit operable to subtract an ideal output derived from the loop detected output from the aligned version of the equalized output to yield a sum; and
a multiplier circuit operable to multiply the sum by a scalar value to yield the noise component.

6. The data processing system of claim 5, wherein the scalar is programmable.

7. The data processing system of claim 5, wherein the scalar is less than unity.

8. The data processing system of claim 5, wherein the system further comprises:
a partial response filter circuit operable to apply partial response filtering to the loop detected output to yield the ideal output.

9. The data processing system of claim 4, wherein the resolution of the data input is thirteen bits, and wherein the resolution of the resolution reduced input is six bits.

10. The data processing system of claim 4, wherein the resolution of the noise component is greater than the resolution of the resolution reduced input.

11. The data processing system of claim 4, wherein the sample based noise injection circuit comprises:
a selector circuit operable to select between a zero value and the noise component as a noise additive; and
a summation circuit operable to add the aligned version of the equalized output to the noise additive to yield the processing input.

12. The data processing system of claim 4, wherein the processing circuit comprises:
a data detector circuit operable to apply a data detection algorithm to the resolution reduced input to yield a detected output; and
a data decoder circuit operable to apply a data decoding algorithm to a decoder input derived from the detected output to yield the data output.

13. The data processing system of claim 12, wherein the data decoder circuit is a low density parity check decoder circuit.

14. The data processing system of claim 12, wherein the data detector circuit is selected from a group consisting of: a maximum a posteriori data detector circuit, and a Viterbi algorithm data detector circuit.

15. The data processing system of claim 4, wherein the system is implemented as an integrated circuit.

16. A method for data processing, the method comprising:
receiving a data input, wherein the data input is derived from an equalized output;
applying a loop detection algorithm to the data input to yield a loop detected output;
generating a noise component based at least in part on the loop detected output;
selecting one of the noise component and a zero component as a sum input;
adding the sum input to an aligned version of the equalized output to yield a selectively noise injected output;
reducing a resolution of the selectively noise injected output to yield a resolution reduced input, such that the resolution of the equalized output is greater than the resolution of the resolution reduced input; and
processing the resolution reduced input to yield a data output.

17. The method of claim 16, wherein generating the noise component based at least in part on the data input comprises:
applying a partial response filtering to the detected output to yield an ideal output;
subtracting the ideal output from the data input to yield a sum; and
multiplying the sum by a scalar to yield the noise component.

18. The method of claim 16, wherein the resolution of the equalized output is thirteen bits, and wherein the resolution of the resolution reduced input is six bits.

19. The method of claim 16, wherein the resolution of the noise component is greater than the resolution of the resolution reduced input.

* * * * *